(12) United States Patent
Sutardja et al.

(10) Patent No.: US 8,796,839 B1
(45) Date of Patent: Aug. 5, 2014

(54) SEMICONDUCTOR PACKAGE INCLUDING A POWER PLANE AND A GROUND PLANE

(75) Inventors: Sehat Sutardja, Los Altos Hills, CA (US); Albert Wu, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 375 days.

(21) Appl. No.: 13/345,449

(22) Filed: Jan. 6, 2012

Related U.S. Application Data

(60) Provisional application No. 61/430,664, filed on Jan. 7, 2011, provisional application No. 61/552,813, filed on Oct. 28, 2011, provisional application No. 61/556,767, filed on Nov. 7, 2011.

(51) Int. Cl.
*H01L 23/04* (2006.01)

(52) U.S. Cl.
USPC .... 257/698; 257/690; 257/777; 257/E23.033; 257/532; 257/693

(58) Field of Classification Search
CPC ............ H01L 23/3114; H01L 23/49805; H01L 24/01; H01L 2223/54486; H01L 2225/06582
USPC .......... 257/532, 676, 690, 777, E23.044, 693, 257/698
See application file for complete search history.

(56) References Cited

U.S. PATENT DOCUMENTS

| | | | |
|---|---|---|---|
| 7,612,978 B2 | 11/2009 | Bergstrom et al. |
| 8,338,940 B2 | 12/2012 | Yamazaki et al. |
| 8,508,954 B2 | 8/2013 | Kwon et al. |
| 8,604,597 B2 | 12/2013 | Jiang |
| 2003/0143964 A1 | 7/2003 | Otsuka et al. |
| 2009/0072930 A1 | 3/2009 | Dutta |
| 2011/0281400 A1 | 11/2011 | Fryklund et al. |
| 2012/0161331 A1 | 6/2012 | Gonzalez et al. |
| 2013/0015585 A1 | 1/2013 | Kosenko et al. |

*Primary Examiner* — Tom Thomas
*Assistant Examiner* — Elias M Ullah

(57) ABSTRACT

An apparatus that comprises a power ground/arrangement that comprises a first semiconductor die configured as a central processing unit (CPU). The power/ground arrangement further comprises a first metal layer that provides only one of (i) a power signal and (ii) a ground signal, and a second metal layer that provides the other one of (i) the power signal and (ii) the ground signal. The apparatus further comprises a second semiconductor die configured as a memory that is coupled to the power/ground arrangement. The second semiconductor die is configured to receive power signals and ground signals from the power/ground arrangement. The second semiconductor die is further configured to provide signals to the CPU via the power/ground arrangement and to receive signals from the CPU via the power/ground arrangement. The second semiconductor die is coupled to the power/ground arrangement only along a single side of the second semiconductor die.

6 Claims, 12 Drawing Sheets

US 8,796,839 B1

SEMICONDUCTOR PACKAGE INCLUDING A POWER PLANE AND A GROUND PLANE

CROSS REFERENCE TO RELATED APPLICATIONS

This disclosure claims priority to U.S. Provisional Patent Application No. 61/430,664, filed Jan. 7, 2011, U.S. Provisional Patent Application No. 61/552,813, filed Oct. 28, 2011, and to U.S. Provisional Patent Application No. 61/556,767, filed Nov. 7, 2011, the entire specifications of which are hereby incorporated by reference in their entireties for all purposes, except for those sections, if any, that are inconsistent with this specification.

TECHNICAL FIELD

Embodiments of the present disclosure relate to the field of integrated circuits, and more particularly, to techniques, structures, and configurations of power and ground planes for electronic package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on semiconductor dies or chips having features that continue to scale in size to smaller dimensions. The shrinking dimensions of these features are challenging conventional routing configurations of power signals and/or ground signals for semiconductor dies in an electronic package assembly (or semiconductor package). For example, the routing of power signals and/or ground signals using conventional pin technologies for multiple semiconductor dies in a same electronic package assembly may considerably increase manufacturing cost of the electronic package assembly.

FIG. 1A illustrates an example conventional semiconductor package 100 that includes a single semiconductor die 102 (or chip). A central processing unit (CPU) 104 and a plurality of switches 106 located along and/or around the periphery of the CPU 104 are integrated on the single semiconductor die 102. In the example of FIG. 1A, the plurality of switches are coupled to the CPU 104 via a metal interconnect layer 108. FIG. 1B illustrates another example of a conventional semiconductor package 108 including two separate semiconductor dies—a first semiconductor die including a switch (switch die 110) and a second semiconductor die including a CPU (CPU die 112). The switch die 110 is coupled to the CPU die 112 via a plurality of wirebonds 114. In the example of FIG. 1B, each of the switch die 110 and the CPU die 112 respectively have power and ground planes.

In both the examples of FIGS. 1A-1B, as a result of the switches being located outside of the periphery of the CPU, when power is needed for the interior circuitry within the CPU, traces or electrical connections (not illustrated) typically have to be run from the periphery of the CPU to the interior of the CPU. Power is often lost or wasted along such traces or electrical connections, thus preventing a CPU from utilizing power efficiently which, in turn, affects an overall performance of the CPU.

SUMMARY

In one embodiment, the present disclosure provides an apparatus that comprises a power ground/arrangement that comprises a first semiconductor die configured as a central processing unit (CPU). The power/ground arrangement further comprises a first metal layer that provides only one of (i) a power signal and (ii) a ground signal, and a second metal layer that provides the other one of (i) the power signal and (ii) the ground signal. The apparatus further comprises a second semiconductor die configured as a memory that is coupled to the power/ground arrangement. The second semiconductor die is configured to receive power signals and ground signals from the power/ground arrangement. The second semiconductor die is further configured to provide signals to the CPU via the power/ground arrangement and to receive signals from the CPU via the power/ground arrangement. The second semiconductor die is coupled to the power/ground arrangement only along a single side of the second semiconductor die.

In another embodiment, the present disclosure provides an apparatus that comprises a semiconductor die configured as a central processing unit (CPU). The apparatus also comprises a switching array disposed on a surface of the CPU. The switching array is communicatively coupled to the CPU.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations for electronic package assemblies having a power/ground arrangement including a power plane and a ground plane, in which the power plane is separate from the ground plane.

Figure 2A:
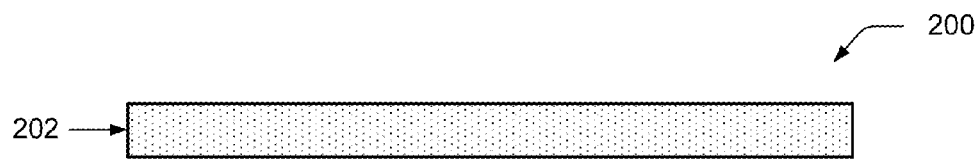
FIGS. 2A-2E illustrate cross-sectional side views of various stages for fabricating a power/ground arrangement.

FIGS. 2A-2G illustrate cross-sectional side views of various stages for fabricating a power/ground arrangement 200. FIG. 2A illustrates a silicon layer or semiconductor die 202. The semiconductor die 202 comprises, for example, silicon (Si), silicon-germanium (SiGe), germanium (Ge), gallium arsenide (GaAs), and the like.

In embodiments, a base metal layer (not illustrated) can be included over the semiconductor die 202. The base metal layer can include, for example, aluminum (Al), aluminum-copper alloy, copper (Cu), or nickel (Ni). Such a base metal layer can be deposited by processes such as, for example, electrodeposition, evaporation, or a sputtering process. The base metal layer can provide input/output (I/O) functionality for the semiconductor die 202. The base metal layer can also serve as a redistribution layer (RDL) for the power/ground arrangement 200.

Figure 2B:
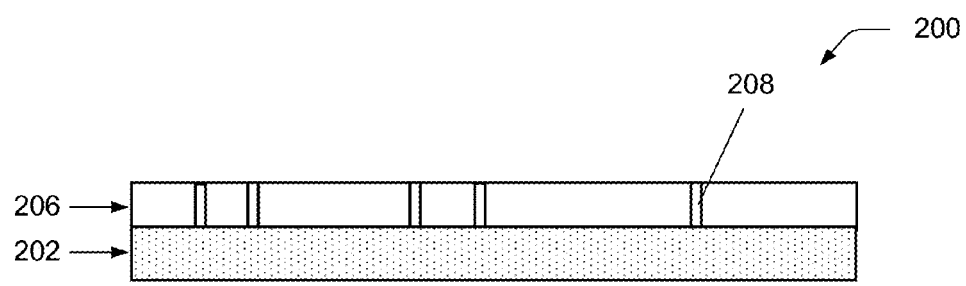

FIG. 2B illustrates an insulating layer 206 formed over the semiconductor die 202. The insulating layer 206 can be formed with any dielectric material including, epoxy, polyimide, low-k dielectric, silicon dioxide ($SiO_2$), or the like. The insulating layer 206 separates the respective conducting parts or layers of the power/ground arrangement 200 from one another and protects the semiconductor die 202 from other conducting metal layers of the power/ground arrangement 200.

A number of device features can be formed in the insulating layer 206. The device features can include, for example, bondable traces, a plurality of lines, and a plurality of vias 208. As illustrated, the vias 208 serve as connectors in the insulating layer 206 to allow a conductive connection between different layers of the power/ground arrangement 200. For example, the vias 208 serve as contacts by connecting the semiconductor die 202 to different conductors, such as additional metal layers of the power/ground arrangement 200. In an embodiment, the vias 208 are formed of metal, as is known in the art.

Figure 2C:
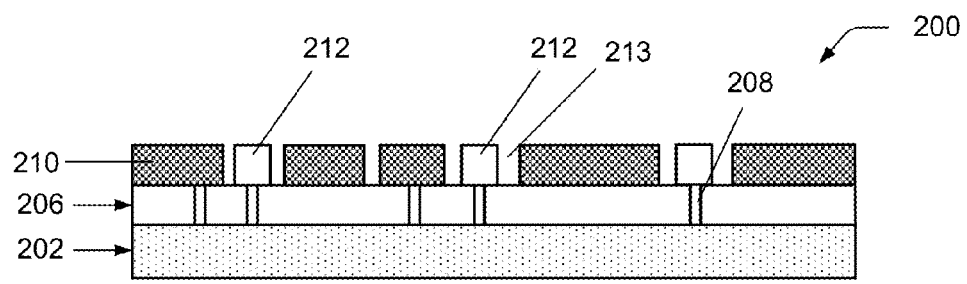

FIG. 2C illustrates a first metal layer 210 formed over the insulating layer 206. The first metal layer 210 can include, for example, copper (Cu), aluminum (Al), aluminum-copper alloy, aluminum-silicon alloy, or nickel (Ni).

In embodiments, an electroplating process, an electrochemical deposition process, or a sputtering process deposits the first metal layer 210 over the insulating layer 206. In yet another embodiment, a damascene process deposits a thin layer of copper that serves as the first metal layer 210 over the insulating layer 206. The first metal layer 210 can be chemically and mechanically planarized in some embodiments. Those skilled in the art are familiar with such processes and thus, these processes will not be described in greater detail herein.

A plurality of islands 212 defined by one or more openings 213 is formed in the first metal layer 210. The islands 212 can have different dimensions and/or shapes with respect to each other if desired. For example, the plurality of islands 212 generally has a substantially rectangular-shape. In embodiments, the shapes for the plurality of islands 212 can include, but are not limited to, a substantially square-shape, a substantially oval-shape, and a substantially round-shape.

In an embodiment, the plurality of islands 212 is located in a center of the first metal layer 210. The plurality of islands 212 provides an electrical pathway between layers of the power/ground arrangement 200. The plurality of islands 212, as well as the openings 213, (in one embodiment) also provides stress relief with respect to the first metal layer 210. The location of the plurality of islands 212 in the center of the first metal layer 210 provides for a shorter electrical path between the layers of the power/ground arrangement 200, as will be discussed in further detail herein. The shorter electrical path leads to better electrical performance, based on less inductance and less resistance being generated.

In an embodiment, the first metal layer 210 is a solid ground (GND) plane. The first metal layer 210 isolates the signals on top of the GND plane from the signals below the GND plane. In particular, the first metal layer 210 isolates the noise for the signals below within the semiconductor die 202, especially during high current switching. The plurality of islands 212 in the first metal layer 210 is configured to connect a signal, for example, such as $V_{DD}$, from another layer through the first metal layer 210 to the semiconductor die 202 to be discussed in further detail herein. The first metal layer 210 acting as a solid GND plane helps reduce a drop in voltage within the power/ground arrangement 200.

Figure 2D:
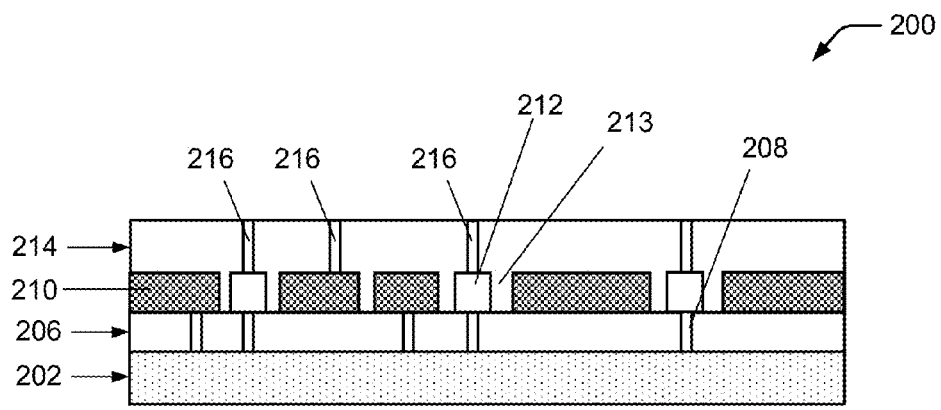

FIG. 2D illustrates a dielectric layer 214 formed over the first metal layer 210. The dielectric layer 214 may be formed with any dielectric material including, for example, oxide, polyimide, low-k dielectric, silicon dioxide ($SiO_2$), or the like. The dielectric layer 214 separates the conducting parts or layers within the power/ground arrangement 200 from one another and protects the first metal layer 210 from the other conducting metal layers. In an embodiment, the dielectric layer 214 is an interlayer dielectric layer.

A number of device features can be formed in the dielectric layer 214. The device features may include, for example, bondable traces, a plurality of lines, and a plurality of vias 216. The vias 216 are a connector in the dielectric layer 214 to connect the first metal layer 210 and the semiconductor die 202 to different conductors, such as additional metal layers within the power/ground arrangement 200. In an embodiment, the vias 216 are formed of metal, as is known in the art.

In an embodiment, the vias 216 in the dielectric layer 214 can be positioned in locations that correspond to the locations of the vias 208 of the insulating layer 206 and islands 212. In other words, the vias 208, 216 and islands 212 can be located in similar positions in their respective layers such that the vias 208, 216 and islands 212 are substantially aligned relative to one another.

Figure 2E:
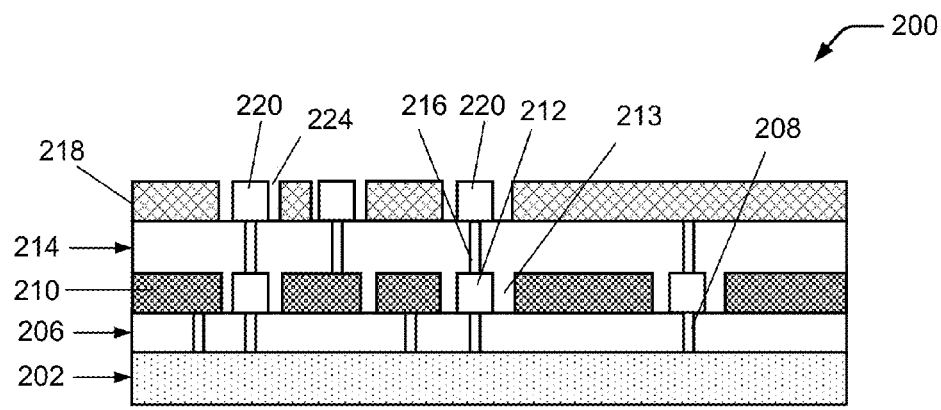

FIG. 2E illustrates a second metal layer 218 formed over the dielectric layer 214. The second metal layer 218 can include, for example, aluminum (Al), aluminum-copper alloy, aluminum-silicon alloy, nickel, or copper (Cu). In embodiments, the second metal layer 218 can be formed over the dielectric layer 214 using suitable processes that are well known, for example, a physical vapor deposition (PVD) process a sputtering process, an electrodeposition, or an evaporative deposition. Those skilled in the art are familiar with such processes and thus, these processes will not be described herein.

A plurality of islands 220, defined by openings 224, is formed on the second metal layer 218 to provide stress relief and to provide electrical pathways. The islands 220 can have different dimensions and/or shapes with respect to each other if desired. For example, in one embodiment, the plurality of islands 220 has a substantially rectangular-shape. In other embodiments, the shapes of the plurality of islands 220 include, but are not limited to, a substantially square-shape, a substantially oval-shape, and a substantially round-shape.

In an embodiment, the plurality of islands 220 is located in a center of the second metal layer 218. The location of the plurality of islands 220 in the center of the second metal layer 218 provides for a shorter electrical path from the second metal layer 218 to a die stacked on top of the power/ground arrangement 200, as will be described in further detail herein. The shorter electrical path provides better electrical performance, based on less inductance and less resistance being generated. In an embodiment, some of the plurality of islands 220 in the second metal layer 218 are positioned in locations that correspond to the locations of some of the plurality of islands 212 of the first metal layer 210. In other words, some of the plurality of islands 220, 212 are located in similar positions on each of their respective metal layers 218, 210 such that the plurality of islands 220, 212 are substantially aligned.

In an embodiment, the second metal layer 218 serves as a power plane, which power plane is configured to provide power at the top of the power/ground arrangement 200. The second metal layer 218 receives power from an external device (not illustrated) through a wirebond connection and provides power to the semiconductor die 202 through the vias 208, 216 and islands 212 and 220 aligned with the vias 208, 216.

A passivation layer (not illustrated) may be formed over the second metal layer 218. The passivation layer may be formed with any suitable material including, for example, oxide, nitride, silicon-oxide, silicon-nitride, or the like. The passivation layer is generally chemically or mechanically planarized. The passivation layer is not required to be planarized if desired. The passivation layer protects the underlying metal layers and the fine-line metal interconnections. The passivation layer also prevents the penetration of mobile ions and other contaminations.

Thus, as can be seen, the power/ground arrangement 200 includes separate ground and power planes (e.g., the first metal layer 210 and the second metal layer 218, respectively) to provide ground and/or power signals to the semiconductor die 202. The separate ground and power planes can also provide ground and/or power signals to other dies as will be described in further detail herein.

Figure 3:
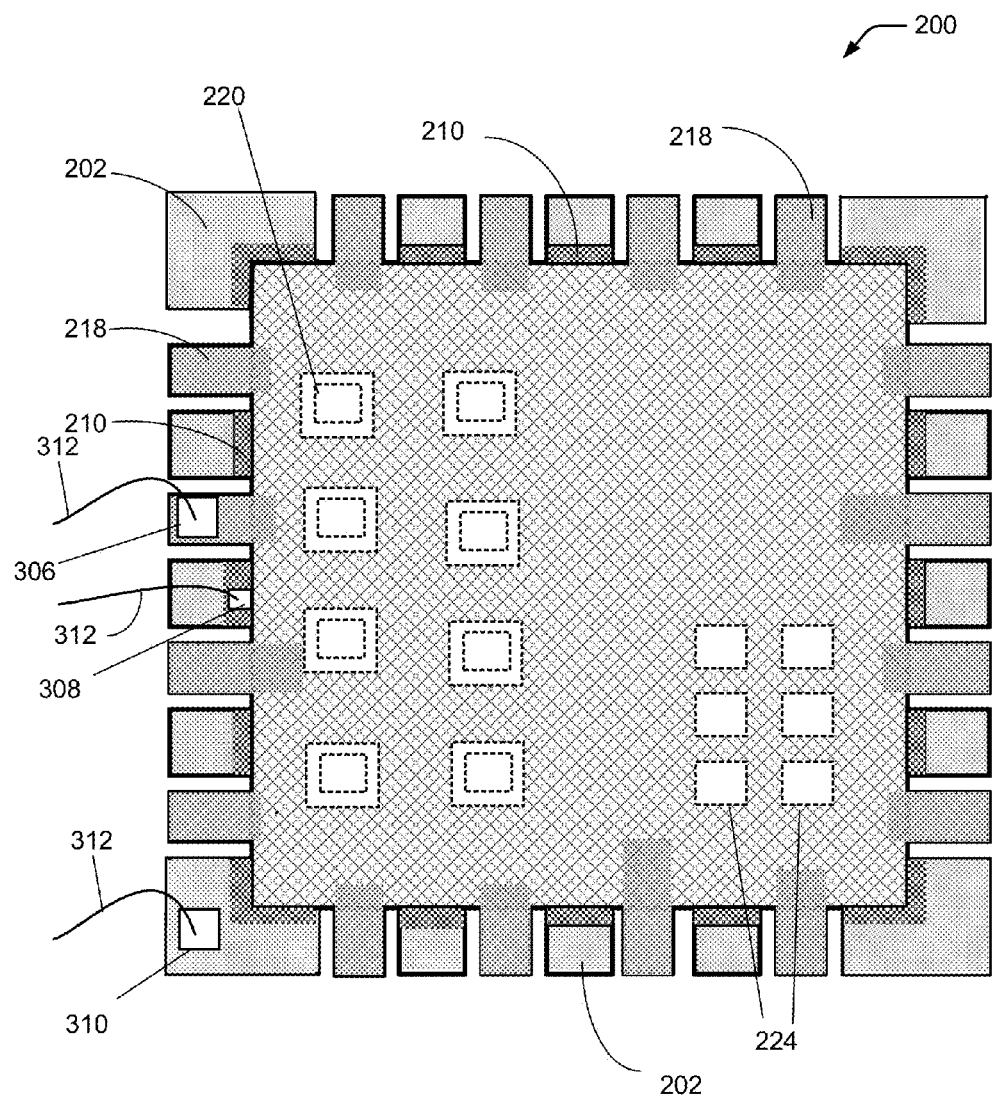
FIG. 3 illustrates a top view of the arrangement of FIGS. 2A-2E.

FIG. 3 illustrates a top view of the power/ground arrangement 200 of FIGS. 2A-2E. The top view illustrates exposed portions of the semiconductor die 202, the second metal layer 218, and exposed portions of the first metal layer 210, as well as the plurality of islands 220 in the second metal layer 218. The exposed portions of the semiconductor die 202 and the first metal layer 210 are located along a periphery of the power/ground arrangement 200 to allow for wirebond connections to the various layers.

The plurality of islands 220 provides electrical pathways and, in one embodiment, also provides stress relief. Likewise, the one or more openings 224 can provide stress relief, some of which may not define islands 220. For example, the stress in the second metal layer 218 results from differences in thermal expansion or from the microstructure of the second metal layer 218 (intrinsic stress). Locations for the plurality of islands 220 are illustrated as examples, not as actual placement locations. The plurality of islands 220 further represent examples without limiting the number, which may be formed in the second metal layer 218, as well as without limiting a size, dimension or a shape.

FIG. 3 further illustrates examples of multiple contact points. For instance, the contact points provide electrical connections with the bond pads 306, 308, 310 coupled to bondwires 312 at multiple locations. The bond pads 306, 308, 310 are generally located along a peripheral edge of the semiconductor die 202 on exposed portions of the semiconductor die 202 and the metal layers 210 and 218. For example, bond pad 306 is located on the second metal layer 218, bond pad 308 is located on an exposed portion of the first metal layer 210, and bond pad 310 is located on an exposed portion of the semiconductor die 202.

In an embodiment, the $V_{DD}$ power from an external device (not illustrated) is received at the bond pad 306 located on the second metal layer 218 through the bondwire 312. The $V_{DD}$ power is provided from the second metal layer 218 to the semiconductor die 202 through pathways defined by a via 216, an island 212 and a via 208 (as illustrated in FIGS. 2B-2E). Isolation is provided in the power/ground arrangement 200 to avoid unwanted interaction of components with each other. For example, the vias 208, 216 make contact with the first metal layer 210, which serves as the GND plane appearing to the signals as an infinite ground potential.

In another embodiment, the GND signal is received at the bond pad 308 of the first metal layer 210 through the bondwire 312. The GND signal can then be provided to the semiconductor die 202 through a via 208. Additionally, the plurality of islands 220 provide an electrical pathway of the GND signal from the first metal layer 210 to a second die (not illustrated) that can be stacked on top of the power/ground arrangement 200. For example, the electrical pathway of the GND signal can include the first metal layer 210 to the via 216 (illustrated in FIG. 2E of the cross-sectional views), to an island 220, and to the second die stacked on top of the power/ground arrangement 200.

Figure 1A:
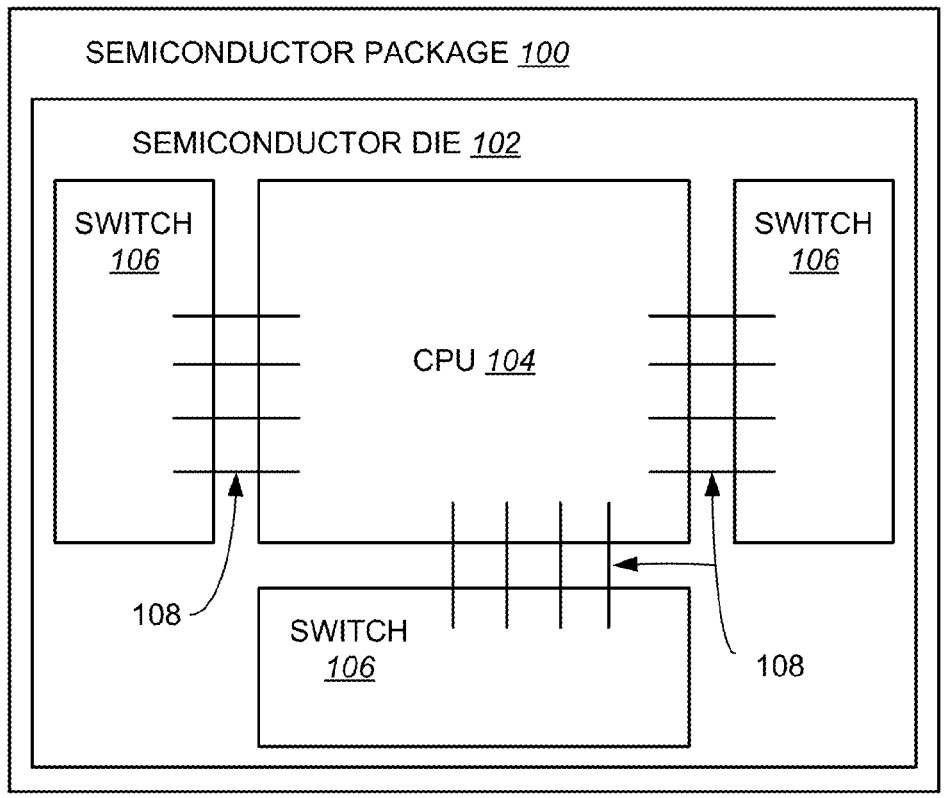
FIGS. 1A-1B schematically illustrate examples of a conventional semiconductor package that includes a CPU and a switching array arranged around (or outside) a periphery of the CPU.
Figure 1B:
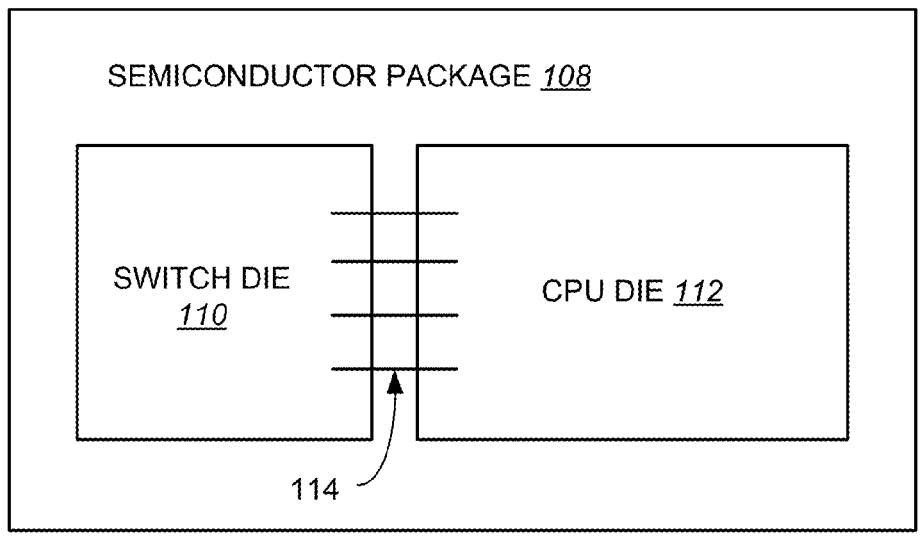

Additionally, an I/O signal can be received at a bond pad 310 of the semiconductor die 202 through a bondwire 312, either from an external device (not illustrated) or from the semiconductor die 202. Also, an I/O signal can be brought from the semiconductor die 202 through the second metal layer 218 and/or to the second die stacked on top of the power/ground arrangement 200. For example, the electrical pathway of the I/O signal begins at the semiconductor die 202, passes through the via 208 (illustrated in FIGS. 1B-1E of the cross-sectional views), and passes through an island 212 in the first metal layer 210 (i.e., the GND plane). The electrical pathway further passes through the via 216 (illustrated in FIG. 1E of the cross-sectional views), to the second metal layer 218 (i.e., the power plane), and to the second die stacked on top of the power/ground arrangement 200.

The power/ground layout of the power/ground arrangement 200 increases the I/O functionality by providing multiple bond pad sites located on the semiconductor die 202, the first metal layer 210, and the second metal layer 218 for the I/O, GND, and/or power signals through the bondwires 312. In addition, the first metal layer 210 as the GND plane reduces the drop in voltage by providing mechanisms for electrical connections to the different layers in a more efficient manner. Overall, this electronic package assembly reduces the drop in voltage and keeps the size of the electronics package small while increasing I/O functionality and keeping costs down.

The roles of the first metal layer 210 and the second metal layer 218 may be reversed such that the first metal layer 210 is the power plane and the second metal layer 218 is the GND plane. Thus, the roles of the plurality of islands 212 in the first metal layer 210 and the plurality of islands 220 in the second metal layer 218 would be reversed such that the plurality of islands 212 in the first metal layer 210 are configured to route the GND signals through the other layers and the plurality of islands 220 in the second metal layer 218 are configured to route the power and I/O signals through the metal layers. For clarity, the Detailed Description will continue to describe the embodiment in which the first metal layer 210 is the GND plane and the second metal layer 218 is the power plane.

Figure 4:
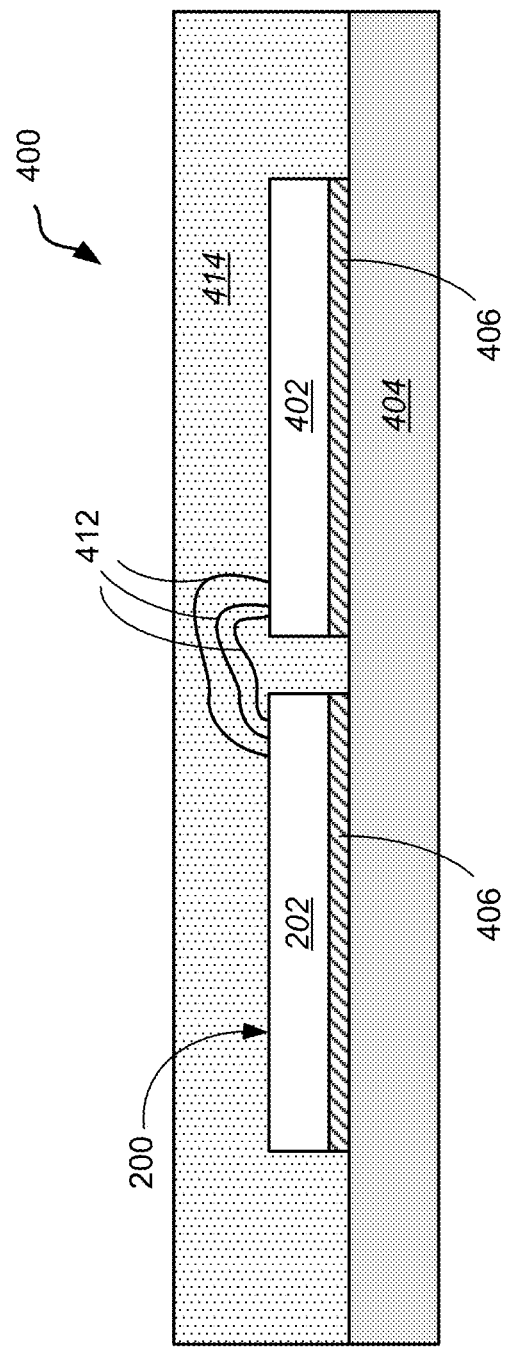
FIG. 4 schematically illustrates a side view of an electronic package assembly that includes the power/ground arrangement of FIGS. 2A-2E.

FIG. 4 schematically illustrates a side view of an electronic package assembly 400 that includes a power/ground arrangement 200, in which the power ground arrangement 200 includes separate ground and power planes (e.g., first metal layer 210 and second metal layer 218) to respectively provide ground and power signals for one or more dies (e.g., a first semiconductor die 202 within the power/ground arrangement 200 and a second semiconductor die 402). In an embodiment, the electronic package assembly 400 includes power/ground arrangement 200, second semiconductor die 402, substrate 404, adhesive 406, one or more bonding wires 412, and molding compound 414, coupled as illustrated.

The power/ground arrangement 200 and the second semiconductor die 402 are mounted/disposed on the substrate 404, as illustrated. The substrate 404 can include, for example, a printed circuit board or a leadframe in some embodiments, but can further include any suitable structure for mounting the power/ground arrangement 200 and the semiconductor die 402 in the electronic package assembly 400 in other embodiments. The substrate 404 can be used to route electrical signals such as the power and/or ground signals from a source external to the electronic package assembly 400 to the power/ground arrangement 200 using any suitable electrical pathway (e.g., wires, not illustrated).

The semiconductor die 402 generally comprises a semiconductor material, such as, for example, silicon. The power/ground arrangement 200 and the semiconductor die 402 are coupled to the substrate 404 using an adhesive 406 such as, for example, an epoxy. The power/ground arrangement 200 and the semiconductor die 402 can be coupled to the substrate 404 using any other suitable technique in other embodiments.

Figure 5:
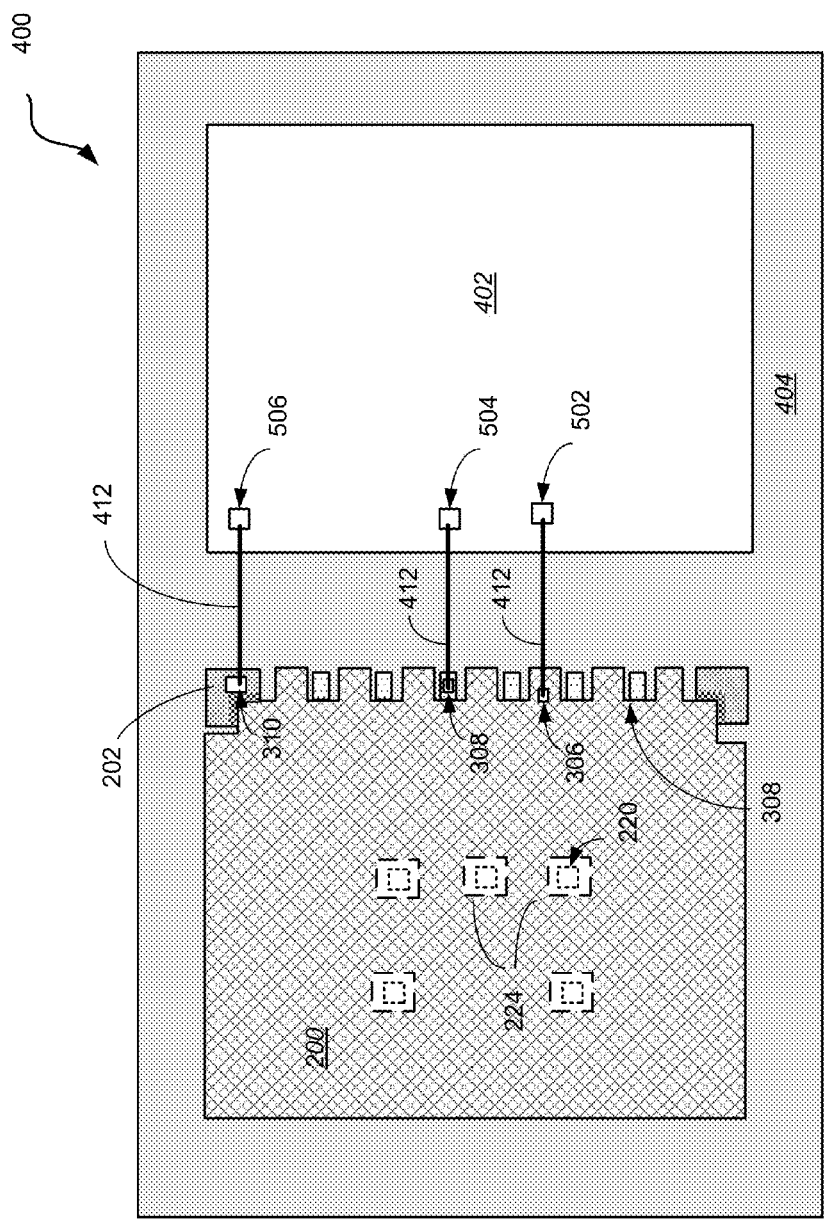
FIG. 5 schematically illustrates a top view of the electronic package assembly of FIG. 4.

FIG. 5 schematically illustrates a top view of the electronic package assembly 400 of FIG. 4. The molding compound 414 of FIG. 4 is not depicted in FIG. 5 for the sake of clarity. Power signals can be routed from the power/ground arrangement 200 to the second semiconductor die 402 using one or more bonding wires 412. As can be seen, the second metal layer 218 at bond pad 306 is electrically coupled to, for example, a bond pad 502 on a surface of the second semiconductor die 402 using a bonding wire 412. In this manner, the power/ground arrangement 200 is configured to route power signals to the second semiconductor die 402. Additional bonding wires 412 and bonding pads 306, 502 may be used to route power signals between the power/ground arrangement 200 and the second semiconductor die 402 if desired.

Ground signals can be routed from the power/ground arrangement 200 to the second semiconductor die 402 using one or more bonding wires 412. As can be seen, the first metal layer 210 at bond pad 308 is electrically coupled to a bond pad 504 on the surface of the second semiconductor die 402 using a bonding wire 412. In this manner, the power/ground arrangement 200 is configured to route ground signals to the second semiconductor die 402. More bonding wires 412 and bonding pads 308, 504 may be used to route ground signals between the power/ground arrangement 200 and the second semiconductor die 402 if desired.

Signals can be routed to and from the semiconductor die 202 in the power/ground arrangement 200 to the second semiconductor die 402 using one or more bonding wires 412. As can be seen, the semiconductor die 202 at bond pad 310 is electrically coupled to a bond pad 506 on the surface of the second semiconductor die 402 using a bonding wire 412. In this manner, the power/ground arrangement 200 is configured to route signals between the semiconductor die 202 (e.g., a CPU die) and the second semiconductor die 402 (e.g., a memory die). More bonding wires 412 and bonding pads 310, 506 may be used to route signals between the semiconductor die 202 and the second semiconductor die 402 if desired.

The second semiconductor die 402 is positioned adjacent and side-by-side to the power/ground arrangement 200. In an embodiment, the semiconductor die 202 within the power/ground arrangement 200 comprises a processor (e.g., system-on-a-chip) and the second semiconductor die 402 comprises memory. In the embodiment of FIGS. 4-5 where the second semiconductor die 402 comprises memory, the memory only needs connections to the power/ground arrangement 200 along one side in order to interact with the semiconductor die 202, and receive power and ground signals from the power/ground arrangement 200.

Although only two semiconductor dies (e.g., semiconductor die 202 and semiconductor die 402) are depicted/described in the electronic package assembly 400 of FIGS. 4 and 5, additional semiconductor dies can be disposed within the electronic package assembly 400 either in a stacked configuration or side-by-side configuration in other embodiments. The additional semiconductor dies can likewise be coupled to the power/ground arrangement 200 for routing of power and/or ground signals using techniques as described herein. For example, the various layers of the power/ground arrangement 200 can be exposed on multiple edges of the power/ground arrangement 200 (as illustrated in FIG. 3) to facilitate electrical coupling of additional dies to the power/ground arrangement 200 using bond pads and bonding wires as described herein. Furthermore, bonding wires may be coupled to islands 220 to route signals to additional semiconductor dies. Also, one or more additional dies may be stacked on top of power/ground arrangement 200, using known techniques, such that the one or more additional semiconductor dies are communicatively coupled with islands 220 to receive signals from the power/ground arrangement 200.

In some embodiments, a molding compound 414 is formed to substantially encapsulate the power/ground arrangement 200, the second semiconductor die 402, and the one or more bonding wires 412. The molding compound 414 generally comprises an electrically insulative material, such as a thermosetting resin, that is disposed to protect the power/ground arrangement 200 and the second semiconductor die 402 from moisture, oxidation, or chipping associated with handling.

Figure 6A:
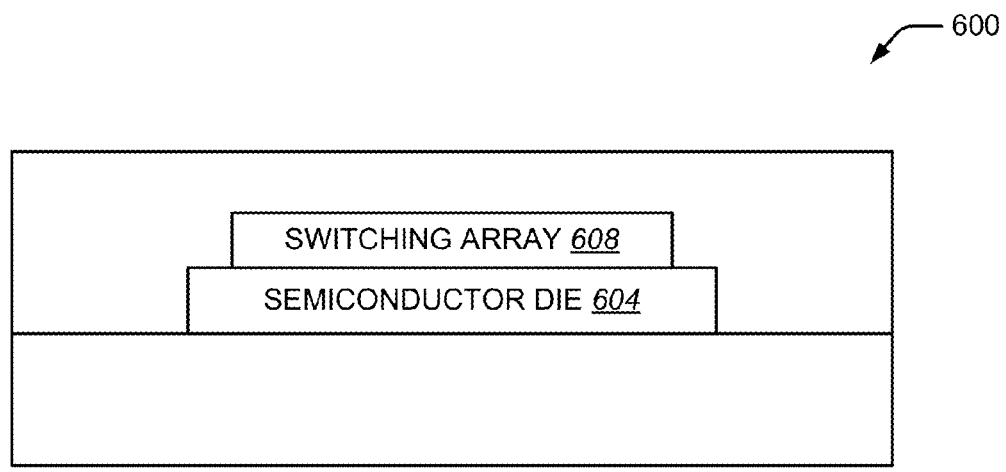
FIG. 6A schematically illustrates a package that includes a semiconductor die and a switching array arranged on top of the semiconductor die.

Referring to FIG. 6A, a semiconductor package 600 is illustrated that includes a semiconductor die 604. In accordance with various embodiments, the semiconductor die 604 is configured as a central processing unit (CPU). The semiconductor package 600 further includes a switching array 608 disposed on top of the semiconductor die 604. The size of the switching array 608 generally approximates the size of the semiconductor die 604. In accordance with various embodiments, the switching array 608 may be identically sized to the semiconductor die 604, or may be different in size with respect to the semiconductor die 604. Furthermore, the switching array 608 may be formed in a separate die that is then coupled to the semiconductor die 604.

Figure 6B:
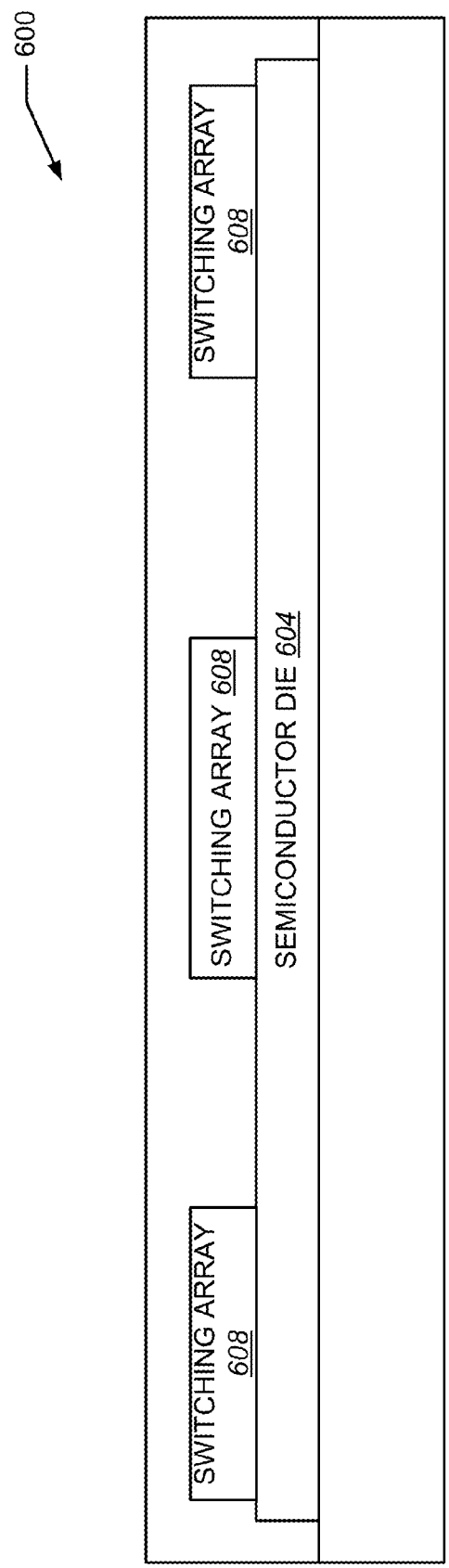
FIG. 6B schematically illustrates a package that includes a semiconductor die and multiple switching arrays arranged on top of the semiconductor die.

FIG. 6B illustrates another embodiment of semiconductor package 600 wherein multiple switching arrays 608 are disposed on top of the semiconductor die 604. It should be understood that other components (not shown), such as, a heat sink, and other semiconductor dies, may be disposed on top of the multiple switching arrays 608. Depending on the design, one or more of the switching arrays 608 may function solely as structural support for components residing on top. For example, the switching array 608 in the middle may provide switching functions and structural support, while the left and the right switching arrays 608 may function solely as structural support for a heat sink (not shown) disposed on top of the switching arrays 608.

In accordance with various embodiments, the switching array 608 is formed as a power/ground arrangement 200 in a manner similar to that described with respect to FIGS. 2A-2E. The silicon layer or semiconductor die 202 within such a power/ground arrangement 200 is configured to include a plurality of switches and capacitors. The power/ground arrangement 200 also includes a ground plane and a power plane, e.g., first metal layer 210 and second metal layer 218, in which the ground plane is separate from the power plane.

Figure 7A:
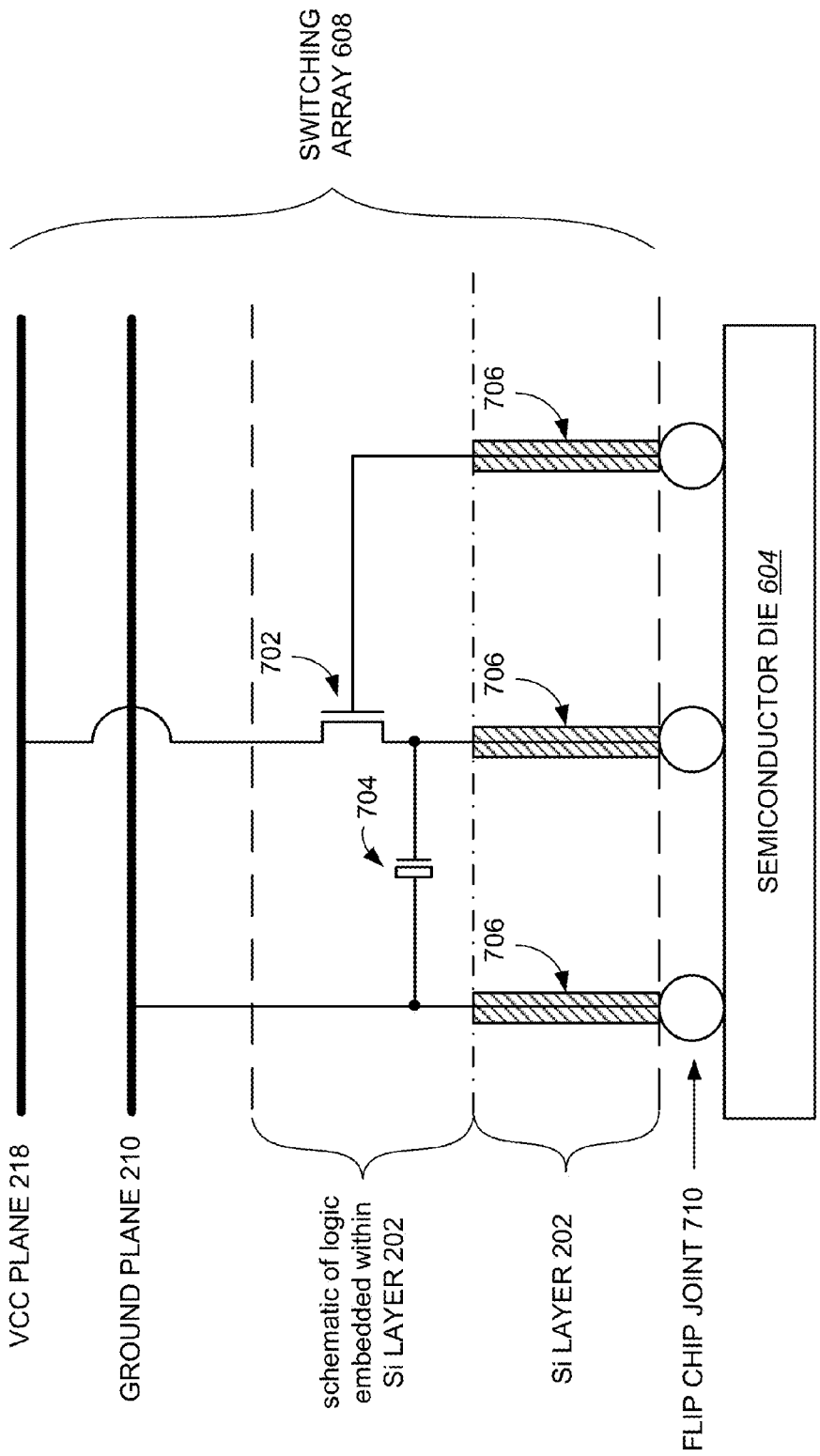
FIGS. 7A and 7B schematically illustrate embodiments of the switching array of FIG. 6A.

Referring to FIG. 7A, a partial schematic view of the switching array 608 and the semiconductor die 604 is illustrated. For the sake of clarity, only one switch 702 and one capacitor 704 are illustrated. It should be understood that the switching array 608 can includes multiple switches and capacitors. As shown in FIG. 7A, the switch 702 and the capacitor 704 are formed within the silicon layer 202 and are coupled to the semiconductor die 604 through an electrical path comprising (through-silicon) vias 706 and a flip chip joint 710. The flip chip joint 710 can be, for example, a solder bump, a gold bump, copper bump, and so on. The vias 706 are defined within the Si layer 202. The ground plane 210 and the power plane 218 are in separate layers and formed in a manner at least similar to the methods previously described with respect to FIGS. 2A-2E.

Figure 7B:
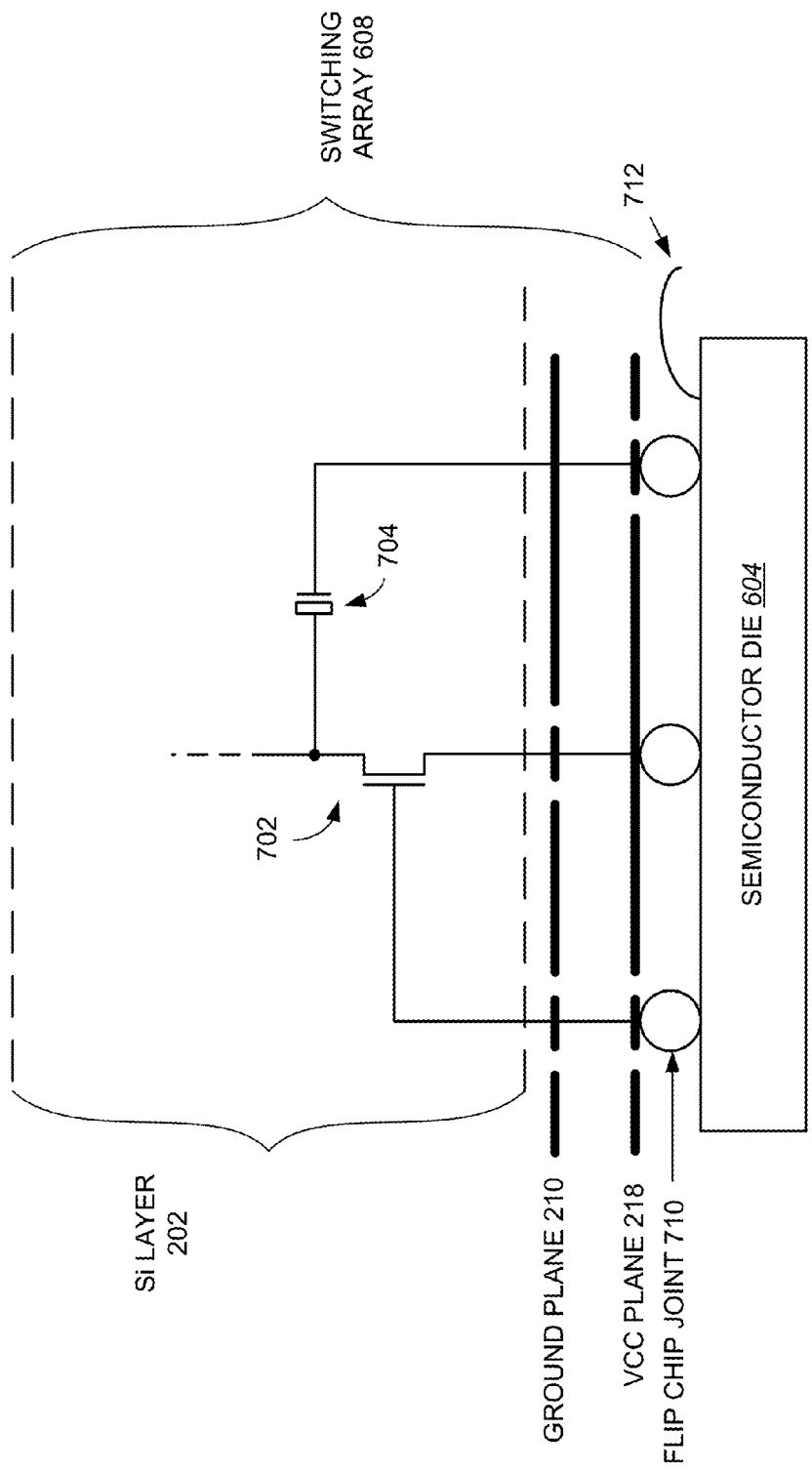

FIG. 7B illustrates another embodiment of the switching array 608. Once again, for the sake of clarity, only one switch 702 and one capacitor 704 are illustrated, but it should be understood that the switching array 608 can include multiple switches and capacitors. The power and ground planes 218 and 210 are situated between the switch 702 and the capacitor 704 configuration and the semiconductor die 604. In an embodiment, the switching array 608 is connected to the semiconductor die 604 via a flip chip joint 710. The flip chip joint 710 can be formed through a flip chip operation, and the flip chip joint 710 generally provides connections at various bonding pads (not illustrated) on the switching array 608 and bonding pads on the semiconductor die 604. In an implementation, one or more bonding wires 712 provide an electrical path for signals to and/or from the semiconductor die 604.

Figure 8:
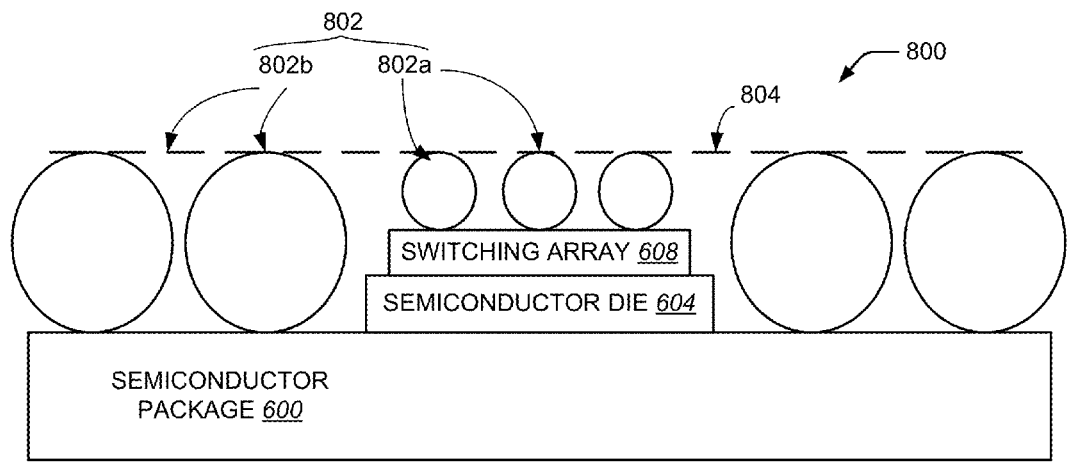
FIG. 8 schematically illustrates the package of FIG. 6A including solder balls.

FIG. 8 illustrates an embodiment of a package arrangement 800 wherein solder balls or bumps 802 are added to the semiconductor package 600. As can be seen, due to the slight increase in thickness where the switching array 608 is on top of the semiconductor die 604, the solder balls 802a are slightly smaller than the solder balls 802b. Thus, the semiconductor package 600 with the solder balls 802 is generally the same height with respect to line 804. In other embodiments, the switching array 608 and the semiconductor die 604 may be very thin relative to the solder balls or bumps 802b, and thus, solder balls or bumps 802a and 802b have substantially the same size and height.

Figure 9:
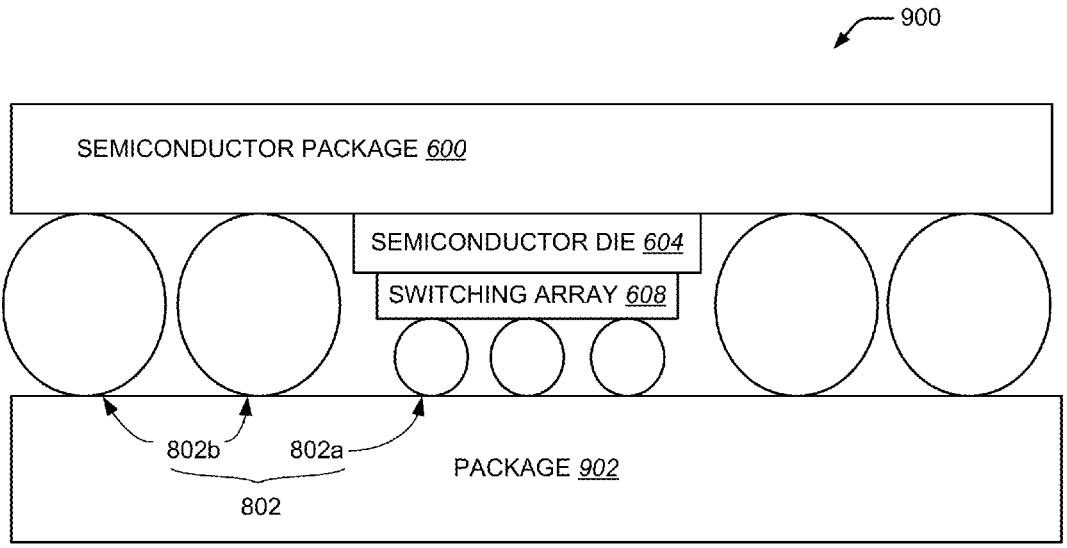
FIG. 9 schematically illustrates a package including the package of FIG. 6A coupled to a ball grid array (BGA) package with the solder balls illustrated in FIG. 8.

FIG. 9 illustrates an embodiment a package arrangement 900 wherein the package arrangement 800 of FIG. 8 is flipped onto a package 902, e.g., a ball grid array (BGA) via a flip chip operation. The solder balls 802 provide electrical connections between the semiconductor package 600, including the semiconductor die 604 and switching array 608, and the BGA 902. In other embodiments, other electrical connections that are known may be used in place of the solder balls 802. For example, the semiconductor package 600 and the BGA 902 may not be stacked on top of each other, but rather may be in a side by side arrangement and thus, bonding wires may be used.

Signals between the BGA 902 and the semiconductor die 604 (including signals from the power and ground planes) may be provided through the solder balls 802 and through the switches 702 and capacitors 704 of the switching array 608, as well as the vias defined within the power/ground arrangement 200 and/or the intermediate layer 708. With the switching array 608 located on top of the semiconductor die 604, delivery of power to the semiconductor die 604 is more efficient. This is generally due to the fact that the distance from the switching array 608 to the interior of the semiconductor die 604 is shorter and more direct, thus reducing power loss or waste along the traces or electrical connections. In general, the switching array 608 is generally maintained as thin as possible. In accordance with various embodiments, the switching array 608 has a thickness of approximately 20 microns. Additionally, while the switching array 608 has been described as being formed in a manner similar to that with respect to power/ground arrangement 200 and then coupled to the semiconductor die 604, the switching array 608 may be formed directly on the semiconductor die 604.

Figure 10:
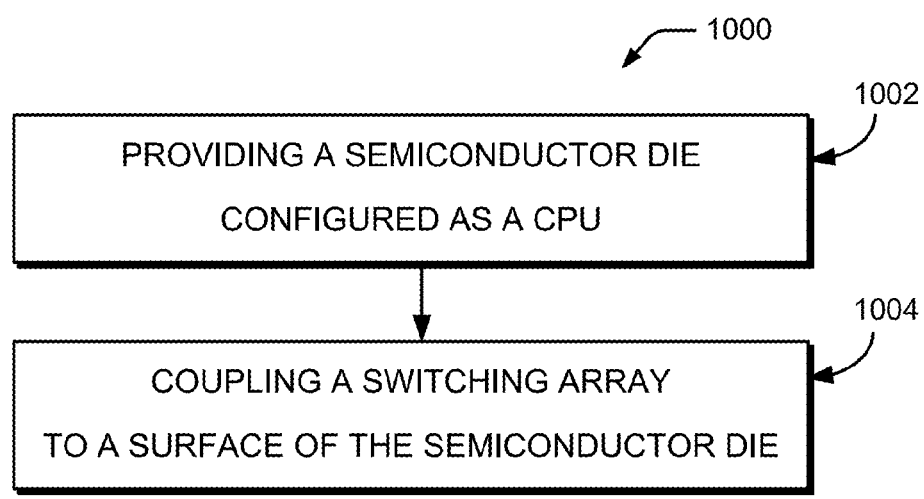
FIG. 10 is a process flow diagram of a method to fabricate a semiconductor package described herein.

FIG. 10 is a process flow diagram of a method 1000 to fabricate a semiconductor package (e.g., semiconductor package 600 of FIG. 6A) described herein. At 1002, the method 1000 includes providing a semiconductor die configured as a CPU. At 1004, the method further includes coupling a switching array to a surface of the semiconductor die. In an embodiment, the switching array is coupled to the semiconductor die via a flip chip operation. In another embodiment, the switching array is coupled to the semiconductor die by forming the switching array on the surface of the semiconductor die. In another embodiment, the switching array is coupled to the semiconductor die via an intermediate layer.

The description may use perspective-based descriptions such as over/under. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. For example, although semiconductor die 604 is described as being configured as a CPU, the semiconductor die 604 can be generally configured to implement any logic or circuitry requiring a ground and power for operation. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
a power ground/arrangement comprising
a first semiconductor die configured as a central processing unit (CPU),
a first metal layer, the first metal layer to provide one of (i) power signals or (ii) ground signals, and
a second metal layer, the second metal layer to provide another one of (i) the power signals or (ii) the ground signals; and
a second semiconductor die configured as a memory, the second semiconductor die being coupled to the power/ground arrangement,
wherein the second semiconductor die is configured to receive the power signals and the ground signals from the power/ground arrangement,
wherein the second semiconductor die is further configured to provide input signals to the first semiconductor die via the power/ground arrangement and to receive output signals from the first semiconductor die via the power/ground arrangement,
wherein the second semiconductor die is coupled to the power/ground arrangement along a side of a periphery of the second semiconductor die,
wherein at least one first portion of the first metal layer is exposed along an edge of the power/ground arrangement,
wherein at least one second portion of the first semiconductor die is exposed along the edge of the power/ground arrangement, and
wherein the second semiconductor die is coupled to the power/ground arrangement at the at least one first portion and the at least one second portion.

2. The apparatus of claim 1, wherein:
the first metal layer is configured to provide the ground signals; and
the second metal layer is configured to provide the power signals.

3. The apparatus of claim 1, wherein the first metal layer includes at least one island defined therein to provide an electrical pathway between the first semiconductor device and the second metal layer through the first metal layer.

4. The apparatus of claim 3, wherein:
the second metal layer includes at least one island defined therein to provide an electrical pathway between another semiconductor die and the first metal layer.

5. The apparatus of claim 1, wherein the second semiconductor die is coupled to the second metal layer at the edge of the power/ground arrangement.

6. The apparatus of claim 1, wherein the first metal layer and the second metal layer comprise at least one of (i) copper and (ii) aluminum.

* * * * *